United States Patent
Takano et al.

(10) Patent No.: US 10,665,670 B2
(45) Date of Patent: May 26, 2020

(54) SEMICONDUCTOR DEVICE AND METHOD FOR MANUFACTURING SAME

(71) Applicant: Mitsubishi Electric Corporation, Tokyo (JP)

(72) Inventors: Kazutoyo Takano, Fukuoka (JP); Kazushige Matsuo, Fukuoka (JP); Masayoshi Hirao, Fukuoka (JP); Junji Yahiro, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/082,957

(22) PCT Filed: Jul. 20, 2016

(86) PCT No.: PCT/JP2016/071276
§ 371 (c)(1),
(2) Date: Sep. 7, 2018

(87) PCT Pub. No.: WO2018/016029
PCT Pub. Date: Jan. 25, 2018

(65) Prior Publication Data
US 2019/0157389 A1    May 23, 2019

(51) Int. Cl.
*H01L 29/06* (2006.01)
*H01L 21/304* (2006.01)
(Continued)

(52) U.S. Cl.
CPC ........ *H01L 29/0661* (2013.01); *H01L 21/042* (2013.01); *H01L 21/0475* (2013.01);
(Continued)

(58) Field of Classification Search
CPC ............ H01L 29/0661; H01L 29/8613; H01L 29/7397; H01L 29/66348; H01L 29/6631;
(Continued)

(56) References Cited

U.S. PATENT DOCUMENTS 5,643,803 A * 7/1997 Fukada ................ G01P 15/123
438/50
6,992,363 B2 * 1/2006 Akiyama .......... H01L 21/76275
257/347
(Continued)

FOREIGN PATENT DOCUMENTS

JP    S49-78484 A    7/1974
JP    2003-249654 A    9/2003
(Continued)

OTHER PUBLICATIONS

An Office Action mailed by the Japanese Patent Office dated Aug. 6, 2019, which corresponds to Japanese Patent Application No. 2018-528145 and is related to U.S. Appl. No. 16/082,957; with English language translation.
(Continued)

*Primary Examiner* — Victor A Mandala
(74) *Attorney, Agent, or Firm* — Studebaker & Brackett PC

(57) ABSTRACT

A semiconductor device according to the present invention includes a substrate having a cell portion and a terminal portion surrounding the cell portion, a surface structure provided on the substrate, and a back surface electrode provided on the back surface of the substrate, the surface structure includes a convex portion protruding upward above the cell portion, and at least a part of the cell portion is thinner than the terminal portion.

20 Claims, 15 Drawing Sheets

(51) Int. Cl.
  *H01L 29/78* (2006.01)
  *H01L 29/739* (2006.01)
  *H01L 29/12* (2006.01)
  *H01L 27/04* (2006.01)
  *H01L 21/04* (2006.01)
  *H01L 21/683* (2006.01)
  *H01L 27/06* (2006.01)
  *H01L 29/10* (2006.01)
  *H01L 29/16* (2006.01)
  *H01L 29/20* (2006.01)
  *H01L 29/66* (2006.01)
  *H01L 29/861* (2006.01)

(52) U.S. Cl.
  CPC ........ *H01L 21/304* (2013.01); *H01L 21/3043* (2013.01); *H01L 21/6835* (2013.01); *H01L 27/04* (2013.01); *H01L 27/0664* (2013.01); *H01L 29/0623* (2013.01); *H01L 29/1095* (2013.01); *H01L 29/12* (2013.01); *H01L 29/1602* (2013.01); *H01L 29/1608* (2013.01); *H01L 29/2003* (2013.01); *H01L 29/6631* (2013.01); *H01L 29/66045* (2013.01); *H01L 29/66068* (2013.01); *H01L 29/66348* (2013.01); *H01L 29/739* (2013.01); *H01L 29/7397* (2013.01); *H01L 29/78* (2013.01); *H01L 29/8613* (2013.01); *H01L 2221/6834* (2013.01); *H01L 2221/68327* (2013.01)

(58) Field of Classification Search
  CPC ......... H01L 29/66068; H01L 29/66045; H01L 29/2003; H01L 29/1608; H01L 29/1602; H01L 29/1095; H01L 29/0623; H01L 27/0664; H01L 21/6835; H01L 21/3043; H01L 21/0475; H01L 21/042; H01L 2221/6834; H01L 2221/68327; H01L 29/12; H01L 27/04; H01L 29/78; H01L 29/739; H01L 21/304
  See application file for complete search history.

(56) References Cited

U.S. PATENT DOCUMENTS

| | | | |
|---|---|---|---|
| 2006/0263988 A1 | 11/2006 | Takahashi et al. | |
| 2010/0295093 A1 | 11/2010 | Rahimo et al. | |
| 2014/0158859 A1* | 6/2014 | Fukuzaki | H01L 51/0056 250/200 |
| 2014/0361312 A1* | 12/2014 | Yoshikawa | H01L 29/41766 257/76 |
| 2015/0001688 A1* | 1/2015 | Iguchi | H01L 24/06 257/622 |
| 2015/0060938 A1* | 3/2015 | Lu | H01L 29/404 257/139 |
| 2017/0018627 A1* | 1/2017 | Li | H01L 21/0485 |
| 2017/0229573 A1* | 8/2017 | Kinoshita | H01L 29/7811 |
| 2018/0012773 A1* | 1/2018 | Matthias | H01L 21/304 |
| 2018/0151366 A1* | 5/2018 | Endo | H01L 29/0843 |
| 2019/0273094 A1* | 9/2019 | Hall | H01L 21/84 |

FOREIGN PATENT DOCUMENTS

| | | |
|---|---|---|
| JP | 2003-303966 A | 10/2003 |
| JP | 2006-324320 A | 11/2006 |
| JP | 2010-114248 A | 5/2010 |
| JP | 2011-507300 A | 3/2011 |
| JP | 2014-099444 A | 5/2014 |
| JP | 2014-150226 A | 8/2014 |

OTHER PUBLICATIONS

International Search Report issued in PCT/JP2016/071276; dated Sep. 6, 2016.
Written Opinion issued in PCT/JP2016/071276; dated Sep. 6, 2016.
Notification of Transmittal of the International Search Report and the Written Opinion of the International Searching Authority, or the Declaration issued in PCT/JP2016/071276; dated Sep. 6, 2016.
An Office Action mailed by the Japanese Patent Office dated Feb. 12, 2020, which corresponds to Japanese Patent Application No. 2018-528145 and is related to U.S. Appl. No. 16/082,957; with English language translation.

* cited by examiner

SEMICONDUCTOR DEVICE AND METHOD FOR MANUFACTURING SAME

FIELD

The present invention relates to, for example, a semiconductor device used for high power applications, and a method for manufacturing the same.

BACKGROUND

A semiconductor device is disclosed in PTL 1. In this semiconductor device, a center portion of a substrate is formed to be thin in order to reduce the resistance. Furthermore, a peripheral portion of the substrate is made thicker than the center portion in order to maintain the strength.

CITATION LIST

Patent Literature

[PTL 1] JP 2003-303966 A

SUMMARY

Technical Problem

In the semiconductor device shown in PTL 1, a step such as etching is added so that the center portion of the substrate is formed to be thin. Therefore, the manufacturing process becomes complicated.

The present invention has been implemented to solve the foregoing problem, and has an object to provide a semiconductor device capable of reducing resistance and maintaining strength by an easy method, and a manufacturing method for manufacturing the same.

Solution to Problem

A semiconductor device according to the present invention includes a substrate including a cell portion and a terminal portion surrounding the cell portion; a surface structure provided on the substrate; and a back surface electrode provided on a back surface of the substrate, wherein the surface structure includes a convex portion protruding upward above the cell portion, and at least a part of the cell portion is thinner than the terminal portion.

A method of manufacturing a semiconductor device according to the present invention includes a surface step of forming a surface layer on a surface side of a substrate including a cell portion and a terminal portion surrounding the cell portion; a surface structure step of forming a surface structure having a convex portion protruding upward above the cell portion after executing the surface step; a step of sticking a protective film so that the protective film covers the surface structure; a polishing step of polishing a back surface of the substrate while the protective film is stuck; a back surface step of forming a back surface semiconductor layer on a back surface side of the substrate; and a step of forming a back surface electrode on a back surface of the back surface semiconductor layer after executing the polishing step.

Advantageous Effects of Invention

The semiconductor device according to the present invention has a convex portion on a surface side thereof. By polishing the back surface of the substrate under this state, the substrate can be made thin at a position facing the convex portion. Therefore, it is possible to form the cell portion more thinly than the terminal portion without adding any step. Accordingly, the semiconductor device according to the present invention can reduce the resistance thereof and maintain the strength thereof, and can be obtained by a simple manufacturing method.

According to the method of manufacturing a semiconductor device of the present invention, the convex portion is formed on the surface side of the semiconductor device. By polishing the back surface of the substrate under this state, the substrate can be made thin at a position facing the convex portion. Therefore, it is possible to form the cell portion more thinly than the terminal portion without adding any step. Accordingly, in the method of manufacturing a semiconductor device according to the present invention, a semiconductor device which can reduce the resistance thereof and maintain the strength thereof can be obtained by a simple process.

DESCRIPTION OF EMBODIMENTS

Figure 1:
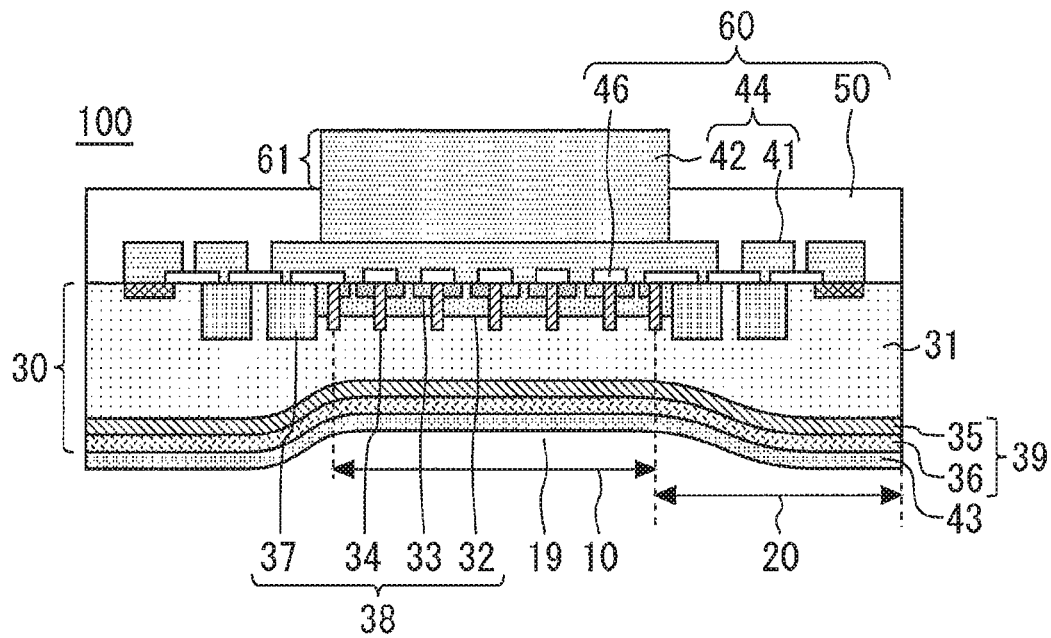
FIG. 1 is a cross-sectional view of a semiconductor device according to an embodiment 1 of the present invention.

A semiconductor device and a method of manufacturing the same according to an embodiment of the present invention are described with reference to drawings. Identical or corresponding constitutional elements are given the same reference numerals, and the repeated description of such constitutional elements may be omitted.

Embodiment 1

FIG. 1 is a cross-sectional view of a semiconductor device according to an embodiment 1 of the present invention. The semiconductor device 100 according to the present embodiment includes a substrate 30. The substrate 30 has a cell portion 10. The cell portion 10 is a region having a cell which is formed therein and through which main current flows in the substrate 30. Furthermore, the substrate 30 has a terminal portion 20 surrounding the cell portion 10. The terminal portion 20 is a region where an edge termination structure is formed in the substrate 30. The edge termination structure is provided to suppress concentration of electric field on an end portion of the semiconductor device 100.

The semiconductor device 100 according to the present embodiment is a trench IGBT (Insulated Gate Bipolar Transistor). The substrate 30 has an N-type drift layer 31. In the cell portion 10, a P--type base 32, an N+-type emitter 33 and a gate 34 are formed on the surface of the drift layer 31. The gate 34 is a trench gate. At the terminal portion 20, an FLR (Field Limiting Ring) structure 37 is formed on the surface of the drift layer 31. An N-type buffer layer 35 is formed on the back surface of the drift layer 31. A P-type collector 36 is formed on the back surface of the buffer layer 35.

In the present embodiment, the substrate 30 includes the drift layer 31, a surface layer 38 and a back surface semiconductor layer 39. The surface layer 38 is a layer formed on a surface side of the substrate 30, and includes the base 32, the emitter 33, the gate 34 and the FLR structure 37. The back surface semiconductor layer 39 is a layer formed on the back surface side of the substrate 30, and includes the buffer layer 35 and the collector 36.

An insulating layer 46 is provided on the gate 34. An aluminum electrode 41 is provided on the insulating layer 46 and the substrate 30. A metal electrode 42 is provided on the aluminum electrode 41 above the cell portion 10. The metal electrode 42 is formed in an entire region above the cell portion 10. The aluminum electrode 41 and the metal electrode 42 form a surface electrode 44.

An insulating film 50 is provided on the surface electrode 44 above the terminal portion 20. The insulating film 50 is formed of so-called glass represented by oxide film and nitride film. The insulating layer 46, the surface electrode 44 and the insulating film 50 constitute a surface structure 60. The upper surface of the metal electrode 42 is higher than the upper surface of the insulating film 50. Therefore, the surface structure 60 has a convex portion 61 protruding upward above the cell portion 10.

A back surface electrode 43 is provided on the back surface of the substrate 30 so as to be in contact with the collector 36. Furthermore, a concave portion 19 is formed at a position facing the metal electrode 42 on the back surface side of the substrate 30. Provision of the concave portion 19 on the back surface side of the substrate 30 makes the cell portion 10 thinner than the terminal portion 20.

Figure 2:
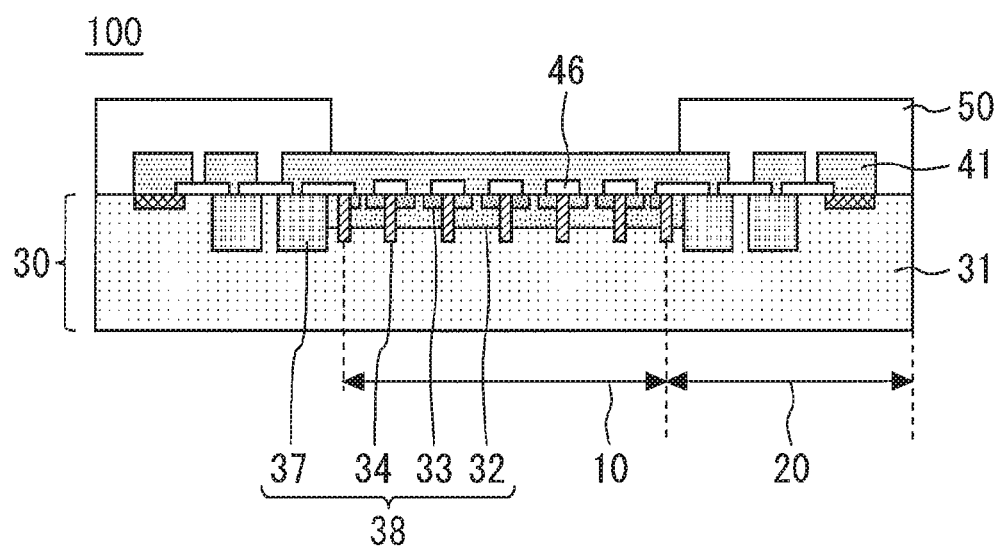
FIG. 2 is a diagram showing the method of manufacturing the semiconductor device according to the embodiment 1 of the present invention.

Next, a method of manufacturing the semiconductor device 100 according to the present embodiment will be described. FIGS. 2 to 7 are diagrams showing the method of manufacturing the semiconductor device according to the embodiment 1 of the present invention. First, a surface step is executed. In the surface step, implantation and diffusion are performed on the substrate 30 to form the drift layer 31 and the surface layer 38 as shown in FIG. 2. Next, a surface structure step is executed. In the surface structure step, the insulating layer 46 is first formed on the gate 34. Subsequently, the aluminum electrode 41 is formed on the substrate 30 and the insulating layer 46. Subsequently, the insulating film 50 is formed on the aluminum electrode 41 above the terminal portion 20. The insulating film 50 is formed by glass coating.

Figure 3:
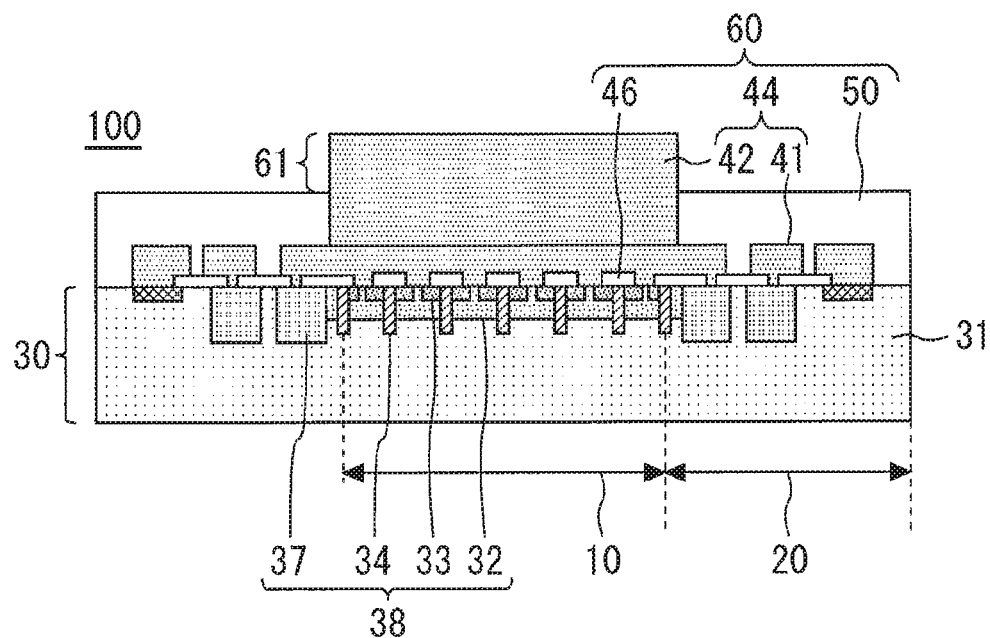
FIG. 3 is a diagram showing the method of manufacturing the semiconductor device according to the embodiment 1 of the present invention.

Subsequently, as shown in FIG. 3, the metal electrode 42 is formed on the aluminum electrode 41 so as to cover the entire region of the upper portion of the cell portion 10. The metal electrode 42 is formed so that the upper surface thereof is located at a position higher than the upper surface of the insulating film 50. Through the above step, the surface structure 60 is formed on the substrate 30. The surface structure 60 has the convex portion 61 protruding upward above the cell portion 10. Here, when a pad electrode is provided on the insulating film 50, the metal electrode 42 is formed so that the upper surface of the metal electrode 42 is located at a position higher than the upper surface of the pad electrode. The metal electrode 42 is formed so that the shape of the surface structure 60 has a convex-shape.

Figure 4:
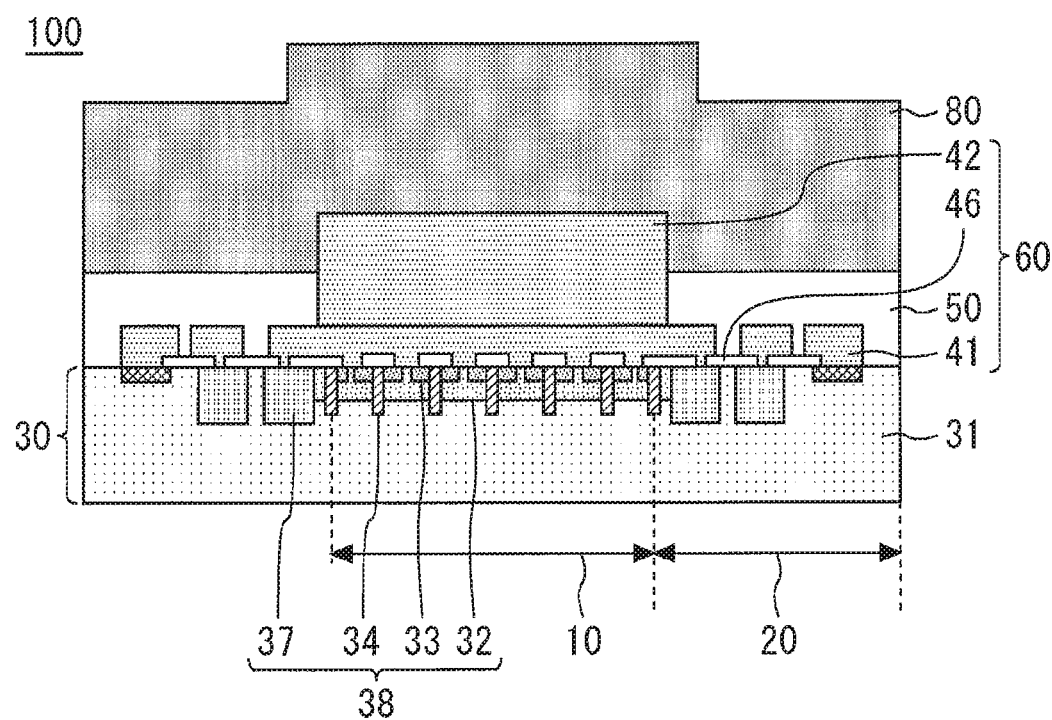
FIG. 4 is a diagram showing the method of manufacturing the semiconductor device according to the embodiment 1 of the present invention.
Figure 5:
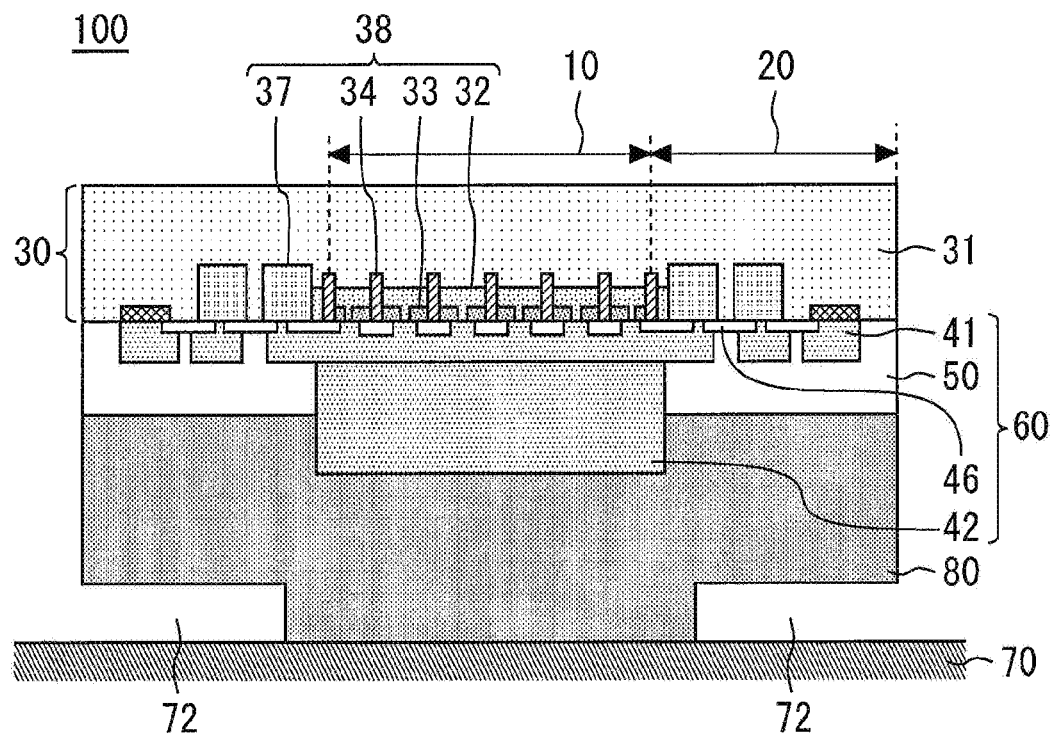
FIG. 5 is a diagram showing the method of manufacturing the semiconductor device according to the embodiment 1 of the present invention.

Subsequently, a protective film 80 is stuck so as to cover the surface structure 60 as shown in FIG. 4. The protective film 80 is an adhesive sheet for protecting the surface of a wafer when the wafer is polished. Next, a polishing step is executed as shown in FIG. 5. In the polishing step, the wafer on which the protective film 80 has been stuck is first placed on a stage 70 so that the back surface of the substrate 30 faces up. At this time, the protective film 80 and the stage 70 are in contact with each other. Subsequently, the back surface of the substrate 30 is polished by a grinder.

Here, with respect to a wafer having irregularities on the surface thereof, when the back surface of the wafer is polished while the protective film is stuck onto the wafer surface, the irregularities of the wafer surface are transferred onto the back surface of the wafer. This is because the pressure applied to the wafer under polishing becomes uneven within a wafer plane due to the irregularities of the wafer surface. At a portion having a convex portion on the wafer surface, the pressure acts strongly under polishing, so that the wafer is deeply polished. Furthermore, at a portion having a concave portion formed on the wafer surface, a gap occurs between the stage and the portion. Therefore, the pressure applied under polishing becomes weak, so that the wafer is shallowly polished.

Accordingly, in the present embodiment, the back surface of the substrate 30 is deeply polished at a position facing the convex portion 61. Since the surface structure 60 has the convex portion 61 above the cell portion 10, a gap 72 is formed between the protective film 80 and the stage 70 above the terminal portion 20. Accordingly, the pressure applied to the terminal portion 20 under polishing becomes weak. Therefore, the terminal portion 20 is polished more shallowly than the cell portion 10. Therefore, the cell portion 10 becomes thinner than the terminal portion 20.

Here, in the present embodiment, the protective film 80 is provided so that the irregularities of the wafer surface are easily transferred onto the back surface under polishing. In order to transfer the irregularities of the wafer surface onto the back surface, it is necessary that the shape of the convex portion 61 appears on the surface of the protective film 80. Therefore, the protective film 80 is brought into close contact with the surface structure 60. Furthermore, a thin protective film is used as the protective film 80. When the protective film is soft, there is a possibility that the protective film cancels the irregularities of the wafer surface. Therefore, the protective film 80 having high rigidity is used. Accordingly, the irregularities of the wafer surface are easily transferred onto the back surface. In the present embodiment, the grinder is used to polish the substrate 30, but polishing may be performed by using CMP (Chemical Mechanical Polishing).

Figure 6:
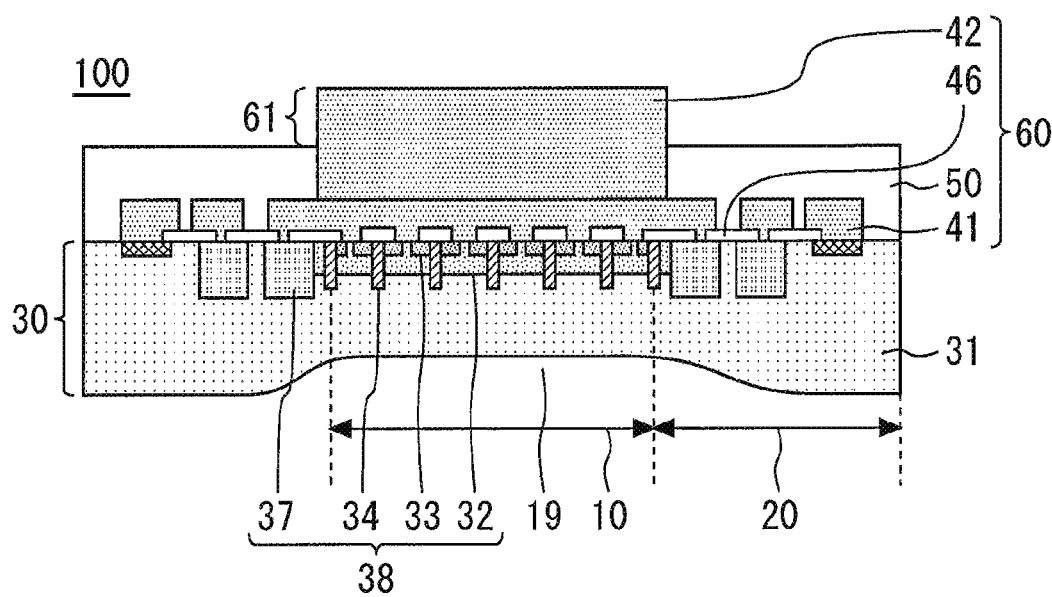
FIG. 6 is a diagram showing the method of manufacturing the semiconductor device according to the embodiment 1 of the present invention.

FIG. 6 shows a state in which the protective film 80 has been removed after the polishing step is executed. In the present embodiment, the surface structure 60 includes the convex portion 61. The shape of the convex portion 61 is transferred onto the back surface of the substrate 30 by the polishing step. Therefore, the cell portion 10 is formed more thinly than the terminal portion 20.

Figure 7:
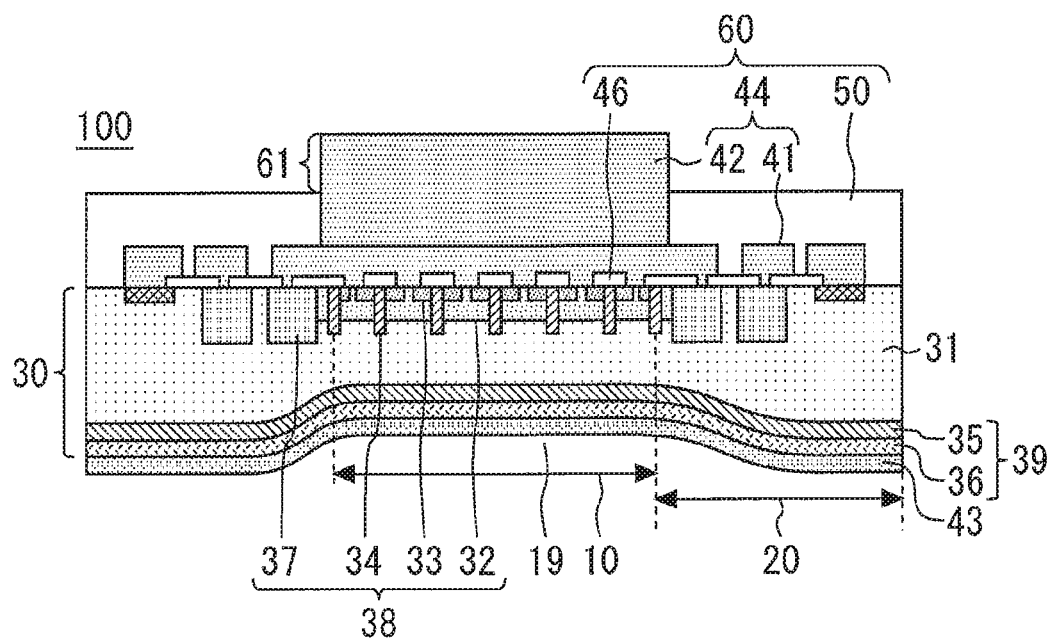
FIG. 7 is a diagram showing the method of manufacturing the semiconductor device according to the embodiment 1 of the present invention.

Next, a back surface step is executed as shown in FIG. 7. In the back surface step, implantation and diffusion are performed on the back surface side of the substrate 30 to form the back surface semiconductor layer 39. Subsequently, the back surface electrode 43 is formed on the back surface of the back surface semiconductor layer 39. Through the above steps, the semiconductor device 100 according to the present embodiment is formed.

Figure 8:
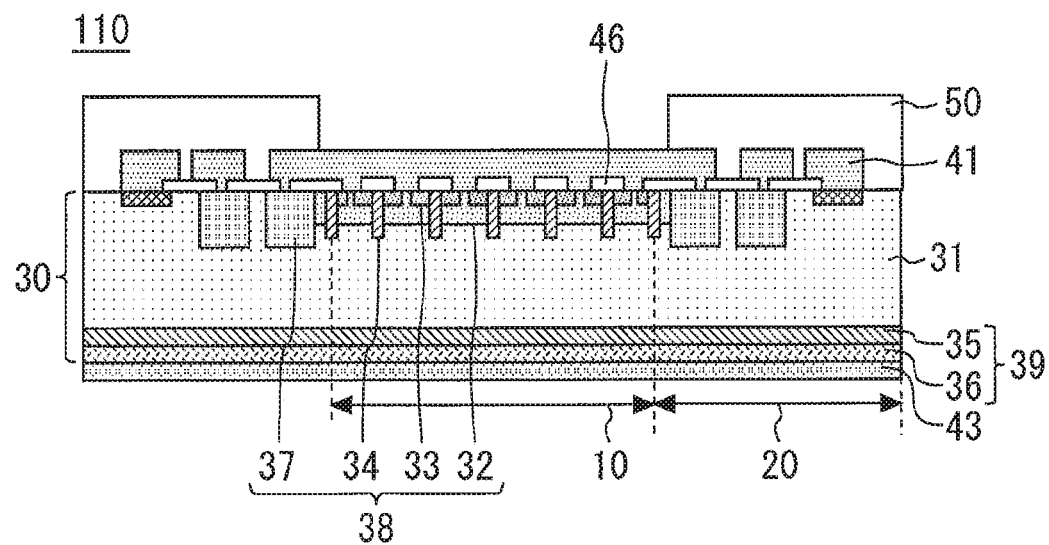
FIG. 8 is a cross-sectional view of a semiconductor device according to a comparative example.

FIG. 8 is a cross-sectional view of a semiconductor device according to a comparative example. The semiconductor device 110 according to the comparative example does not have the metal electrode 42. Therefore, when the back surface of the substrate 30 is polished, the terminal portion as well as the cell portion 10 is thinly formed. Alternatively, there is a possibility that irregularities of the surface of the semiconductor device 110 are transferred, and the cell portion 10 becomes thicker than the terminal portion 20.

Generally, when the substrate becomes thin, the semiconductor device has low resistance. On the other hand, when the substrate becomes thin, the strength decreases. Accordingly, the resistance of the semiconductor device 110 according to the comparative example is reduced by the polishing of the substrate 30, whereas the strength decreases. On the other hand, there is conceivable a structure in which only a center portion of the substrate is thinned and a peripheral portion thereof is left thick. In the semiconductor device having this structure, the resistance is low because the center portion of the substrate is thin, and the strength is maintained because the peripheral portion is thick.

Here, as a method of thinning only the center portion of the substrate, it is conceivable to form a mask by photolithography processing and then perform dry etching or sandblasting. However, this method requires addition of a photolithography processing step and a dry etching or sandblasting step in order to thin the center portion of the substrate. Therefore, the manufacturing process is complicated.

On the other hand, in the present embodiment, the surface structure 60 includes the convex portion 61. In the polishing step, the shape of the convex portion 61 is transferred onto the back surface of the substrate 30. As a result, the cell portion 10 is formed to be thinner than the terminal portion 20. Here, the polishing step of the substrate 30 is a step which has been conventionally executed for the purpose of thinning a wafer, removing oxide film, or removing polysilicon. Accordingly, in the present embodiment, the cell portion 10 can be made thinner than the terminal portion 20 without adding any step. Therefore, it is possible to obtain the semiconductor device 100 capable of reducing resistance and maintaining strength with a simple manufacturing process.

Furthermore, in the present embodiment, the convex portion 61 is formed so as to cover the entire region of the upper portion of the cell portion 10. Therefore, the entire region of the cell portion 10 which is a region where main current flows is thinly formed. Therefore, it is possible to obtain a high effect of reducing the resistance by thinning the substrate 30.

Furthermore, in the present embodiment, the terminal portion 20 is provided to be thicker than the cell portion 10. Therefore, a region where the substrate 30 is thick is provided at the peripheral portion of the semiconductor device 100. Therefore, it is possible to maintain the strength of the semiconductor device 100. Further, the terminal portion 20 is a region where a structure for enhancing the withstand voltage of the semiconductor device 100 is provided. Generally, the withstand voltage tends to be higher as the terminal portion is thicker. Therefore, in the present embodiment, the terminal portion 20 is provided to be thicker than the cell portion 10, which enables the terminal portion 20 to maintain a higher withstand voltage than the cell portion 10.

When a concave portion is formed on the back surface side of the substrate by dry etching such as RIE (Reactive Ion Etching) or sandblasting, a corner may be formed at a step formed by the concave portion. At this time, electric field may concentrate on the corner portion of the step.

In contrast, in the present embodiment, since the convex portion 61 of the wafer surface is transferred to the back surface by the polishing step, no corner is formed in the drift layer 31. Therefore, no corner is also formed in the back surface semiconductor layer 39 and the back surface electrode 43. Therefore, as compared with the case of using dry etching or sandblasting, electric field is easily relaxed. Therefore, the withstand voltage can be enhanced. In the present embodiment, the back surface electrode 43 under the cell portion 10 and the back surface electrode 43 under the terminal portion 20 form a concave shape. The lower surface of the back surface electrode 43 under the cell portion 10 and the lower surface of the back surface electrode 43 under the terminal portion 20 are smoothly connected to each other.

Further, in the present embodiment, the metal electrode 42 is provided on the aluminum electrode 41. The metal electrode 42 is formed to be thick so as to form the convex portion 61 in the surface structure 60. By providing the thick metal electrode 42, strength against wire bonding can be enhanced. Furthermore, reliability of the bonding between a terminal and the metal electrode 42 under direct lead bonding can be enhanced.

Further, in the switching device, electric field inside the substrate may intensify during a transition period of a switching operation. The electric field inside the substrate becomes stronger as the substrate is thinner. In a structure where an aluminum electrode having a thickness of about 5 µm is formed in such a switching device, current may concentrate due to an increase in electric field. Temperature increases due to the concentration of current. For this reason, the resistance of the switching device to current may deteriorate. That is, there is a case where the breakdown tolerance of the switching device is reduced. Here, in the present embodiment, the metal electrode 42 is provided on the aluminum electrode 41. By providing the thick metal electrode 42, spreading resistance of the surface electrode 44 can be reduced. When the spreading resistance of the surface electrode 44 decreases, the concentration of current is suppressed. Therefore, the resistance to current is enhanced. As a result, the breakdown tolerance of the semiconductor device 100 can be enhanced.

The semiconductor device 100 according to the present embodiment is a vertical trench IGBT. As a modification, the semiconductor device 100 may be a vertical power device. For example, the semiconductor device 100 may be an IGBT, a power MOSFET, or a diode. Furthermore, in the present embodiment, the convex portion 61 is formed so as to cover the entire region of the upper portion of the cell portion 10. On the other hand, the convex portion 61 may be formed at a part of the upper portion of the cell portion 10. In this case, a part of the cell portion 10 is formed to be thinner than the terminal portion 20.

Figure 9:
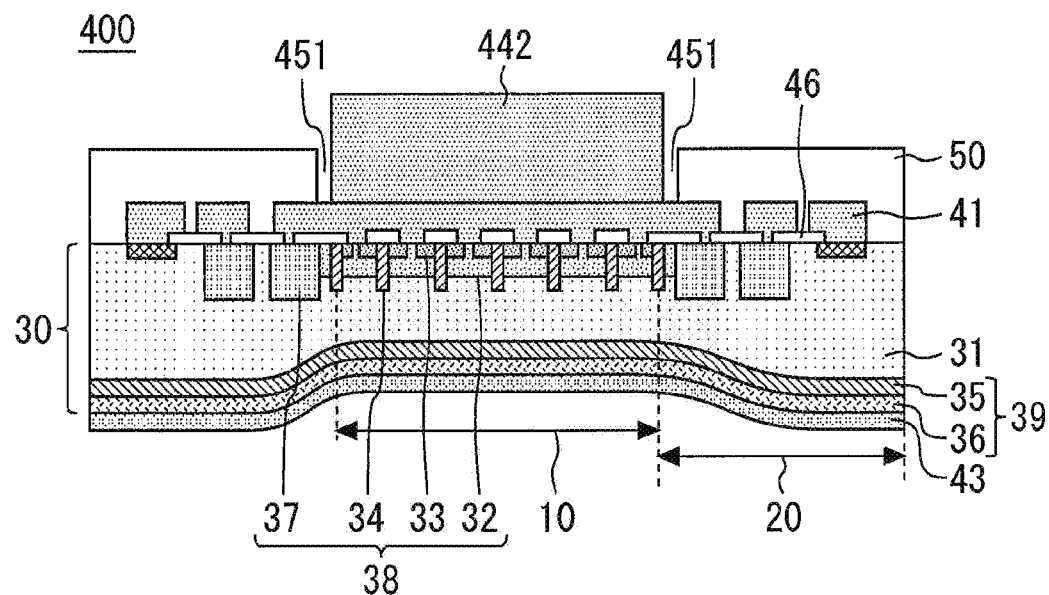
FIG. 9 is a cross-sectional view of a semiconductor device according to a modification of the embodiment 1 of the present invention.

FIG. 9 is a cross-sectional view of a semiconductor device according to a modification of the embodiment 1 of the present invention. The semiconductor device 400 according to the modification includes a metal electrode 442. Other structures are similar to those of the semiconductor device 100. In the semiconductor device 400, a gap 451 is formed between the insulating film 50 and the metal electrode 442.

The metal electrode 442 protrudes upward on the upper surface of the semiconductor device 400. Therefore, when the back surface of the substrate 30 is polished, a strong stress may be applied to the metal electrode 442 in some cases. In the present embodiment, a gap 451 is formed between the insulating film 50 and the metal electrode 442. As a result, the stress applied to the metal electrode 442 in the polishing step can be suppressed from being transmitted to the insulating film 50. Therefore, it is possible to prevent the insulating film 50 as glass from cracking.

Figure 10:
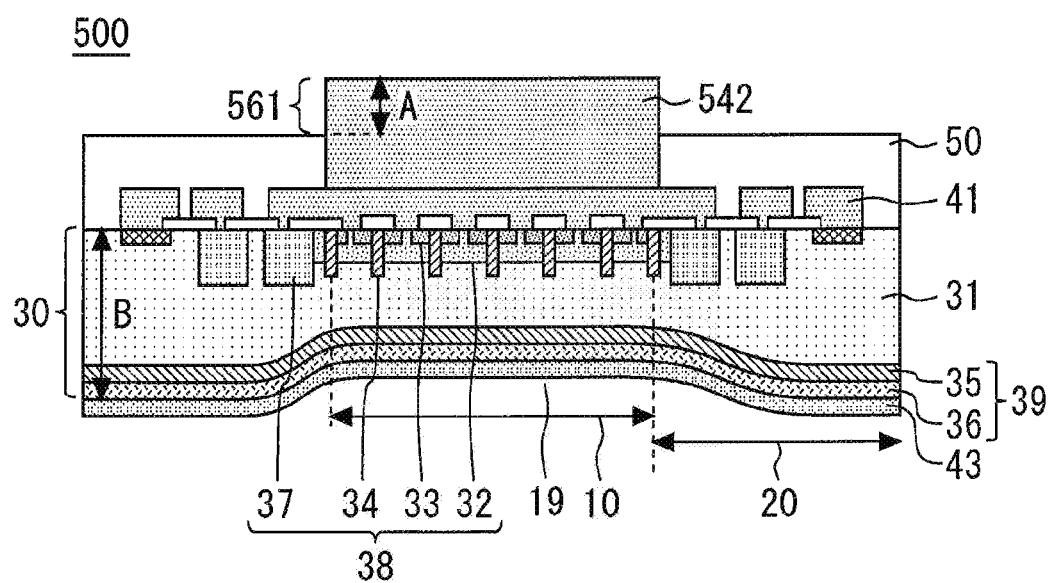
FIG. 10 is a cross-sectional view of a semiconductor device according to a modification of the embodiment 1 of the present invention.

FIG. 10 is a cross-sectional view of a semiconductor device 500 according to another modification of the embodiment 1 of the present invention. The semiconductor device 500 according to the modification includes a metal electrode 542. The thickness A of a convex portion 561 formed with the metal electrode 542 is thinner than the thickness B of the substrate 30. As a result, when the back surface of the substrate 30 is polished, it is possible to prevent a polished portion from penetrating through the substrate 30. In addition, cracking of the substrate 30 caused by thinning of the substrate 30 can be prevented.

The substrate 30 may be formed of a wide bandgap semiconductor. By using a wide bandgap semiconductor, the withstand voltage and the resistance to current can be enhanced. That is, the breakdown tolerance of the semiconductor device 100 can be enhanced. As the wide bandgap semiconductor, silicon carbide, a gallium nitride based material and diamond may be used.

These modifications can be applied, as appropriate, to a semiconductor device and a method of manufacturing the same according to the following embodiments. Note that the semiconductor device and the method of Manufacturing the same according to the following embodiments are similar to those of the first embodiment in many respects, and thus differences between the semiconductor device and the method of manufacturing the same according to the following embodiments and those of the first embodiment will be mainly described below.

Embodiment 2

Figure 11:
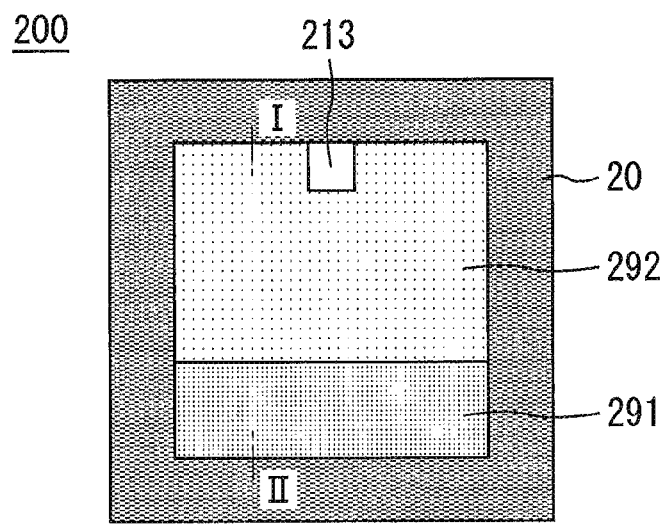
FIG. 11 is a plan view of a semiconductor device according to an embodiment 2 of the present invention.

FIG. 11 is a plan view of a semiconductor device according to an embodiment 2 of the present invention. In the semiconductor device 200 according to the present embodiment, an IGBT 292 and a diode 291 are formed. The diode 291 is formed adjacently to IGBT 292. The IGBT 292 and the diode 291 are surrounded by the terminal portion 20. The structure of a substrate 230 at the terminal portion 20 is the same as that of the embodiment 1. A gate pad 213 for applying a gate voltage to a gate 234 of the IGBT 292 is formed at an end portion of the IGBT 292.

Figure 12:
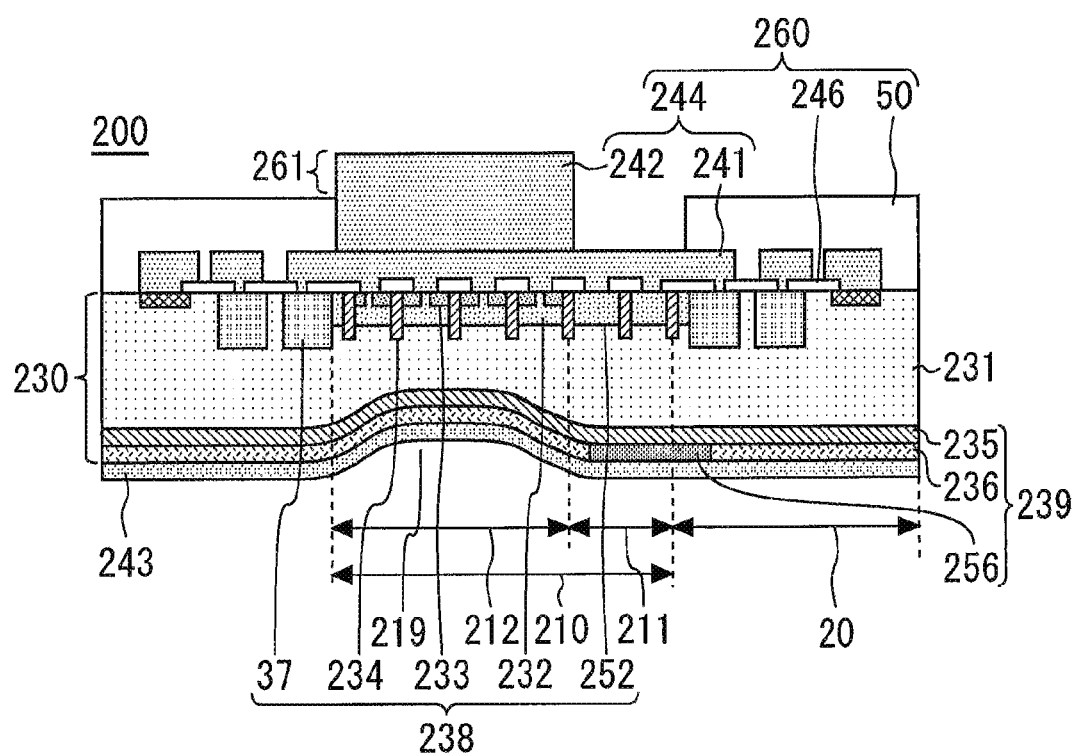
FIG. 12 is a cross-sectional view of a semiconductor device according to the embodiment 2 of the present invention.

FIG. 12 is a cross-sectional view of the semiconductor device according to the embodiment 2 of the present invention. FIG. 12 is a cross-sectional view obtained by cutting the semiconductor device 200 shown in FIG. 11 with a line I-II. The semiconductor device 200 includes a substrate 230, a surface structure 260 provided on the substrate 230, and a back surface electrode 243 provided on the back surface of the substrate 230. The substrate 230 includes a cell portion 210 and a terminal portion 20 surrounding the cell portion 210.

The cell portion 210 is provided with an IGBT region 212 and a diode region 211 provided adjacently to the IGBT region 212. The IGBT region 212 is a region where the IGBT 292 of the cell portion 210 is formed. The diode region 211 is a region where the diode 291 of the cell portion 210 is formed.

The substrate 230 includes an N-type drift layer 231, a surface layer 238, and a back surface semiconductor layer 239. In the IGBT region 212, a $P^-$-type base 232, an $N^+$-type emitter 233 and a gate 234 which is a trench gate are provided on the surface of the drift layer 231. In the diode region 211, a $P^-$-type anode 252 and a gate 234 are provided on the surface of the drift layer 231. Here, the base 232 is the same layer as the anode 252. Furthermore, the diode region 211 may not have the gate 234.

An N-type buffer layer 235 is formed on the back surface of the drift layer 231. A P-type collector 236 is formed on the back surface of the buffer layer 235, In the diode region 211, a part of the collector 236 is replaced by an N-type cathode 256. In the present embodiment, the surface layer 238 includes the base 232, the anode 252, the emitter 233, the gate 234, and the FLR structure 37. In addition, the back surface semiconductor layer 239 includes the buffer layer 235, the collector 236, and the cathode 256.

An insulating layer 246 is provided on the gate 234. Furthermore, an aluminum electrode 241 is provided on the insulating layer 246 and the substrate 230. A metal electrode 242 is provided on the aluminum electrode 241 above the IGBT region 212. The metal electrode 242 is formed over an entire region above the IGBT region 212. The aluminum electrode 241 and the metal electrode 242 form a surface electrode 244. The insulating layer 246, the surface electrode 244, and the insulating film 50 constitute the surface structure 260. The upper surface of the metal electrode 242 is higher than the upper surface of the insulating film 50. Therefore, the surface structure 260 has a convex portion 261 protruding upward above the IGBT region 212.

A back surface electrode 243 is provided on the back surface of the substrate 230 so as to be in contact with the collector 236 and the cathode 256. As described above, in the semiconductor device 200, an IGBT 292 which is a trench IGBT, and a diode 291 are formed. Accordingly, the semiconductor device 200 becomes RC (Reverse Conducting)-IGBT. The diode 291 is formed by replacing a part of the P-type collector 236 with an N-type cathode 256. Furthermore, a concave portion 219 is formed at a position facing the metal electrode 242 on the back surface side of the substrate 230. Provision of the concave portion 219 on the back surface side of the substrate 230 makes the IGBT region 212 thinner than the diode region 211.

Figure 13:
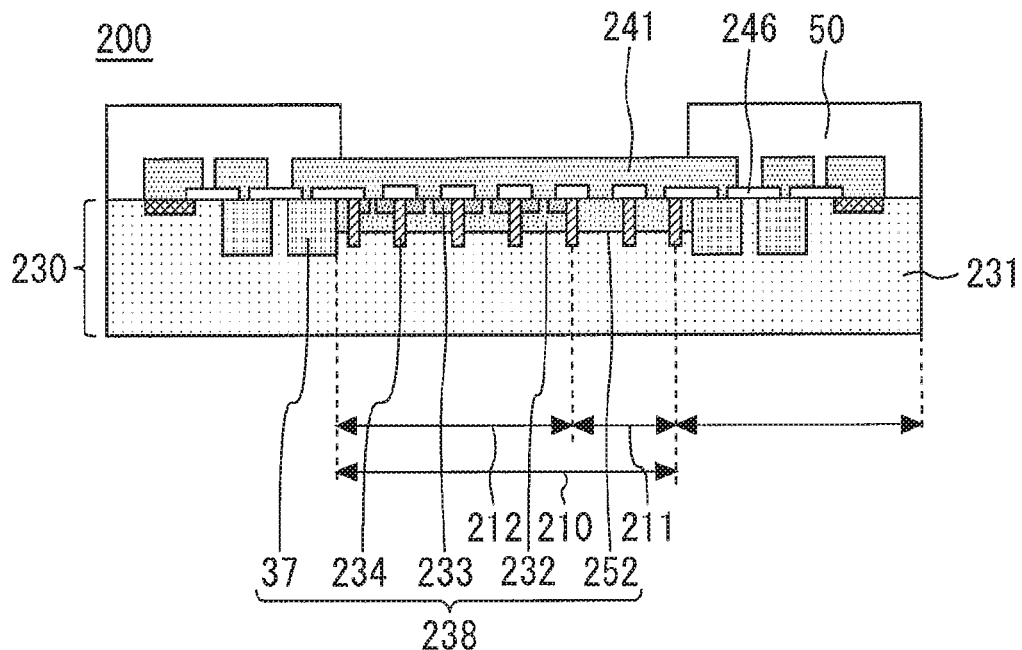
FIG. 13 is a diagram showing a method of manufacturing the semiconductor device according to the embodiment 2 of the present invention.

Next, a method of manufacturing the semiconductor device 200 according to the present embodiment will be described. FIGS. 13 to 17 are diagrams showing a method of manufacturing the semiconductor device according to the embodiment 2 of the present invention. First, a surface step is executed. In the surface step, as shown in FIG. 13, the drift layer 231 and the surface layer 238 are formed on the substrate 230. Subsequently, a surface structure step is executed. In the surface structure step, the insulating layer 246 is first formed on the gate 234. Subsequently, the aluminum electrode 241 is formed on the substrate 230 and the insulating layer 246. Subsequently, the insulating film 50 is formed on the aluminum electrode 241 above the terminal portion 20.

Figure 14:
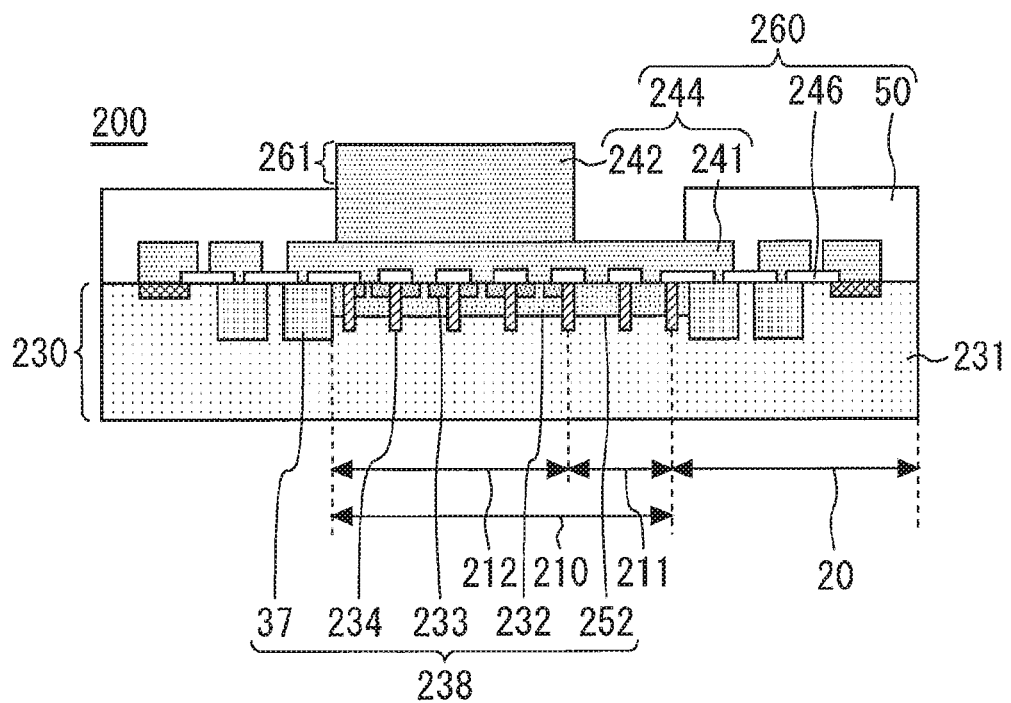
FIG. 14 is a diagram showing a method of manufacturing the semiconductor device according to the embodiment 2 of the present invention.

Subsequently, as shown in FIG. 14, the metal electrode 242 is formed on the aluminum electrode 241 above the IGBT region 212. The metal electrode 242 is formed so as to cover the entire region of the upper portion of the IGBT region 212. As in the ease of the embodiment 1, the metal electrode 242 is formed so that the upper surface thereof is located at a position higher than the upper surface of the insulating film 50, thereby forming the surface structure 260 including the convex portion 261.

Figure 15:
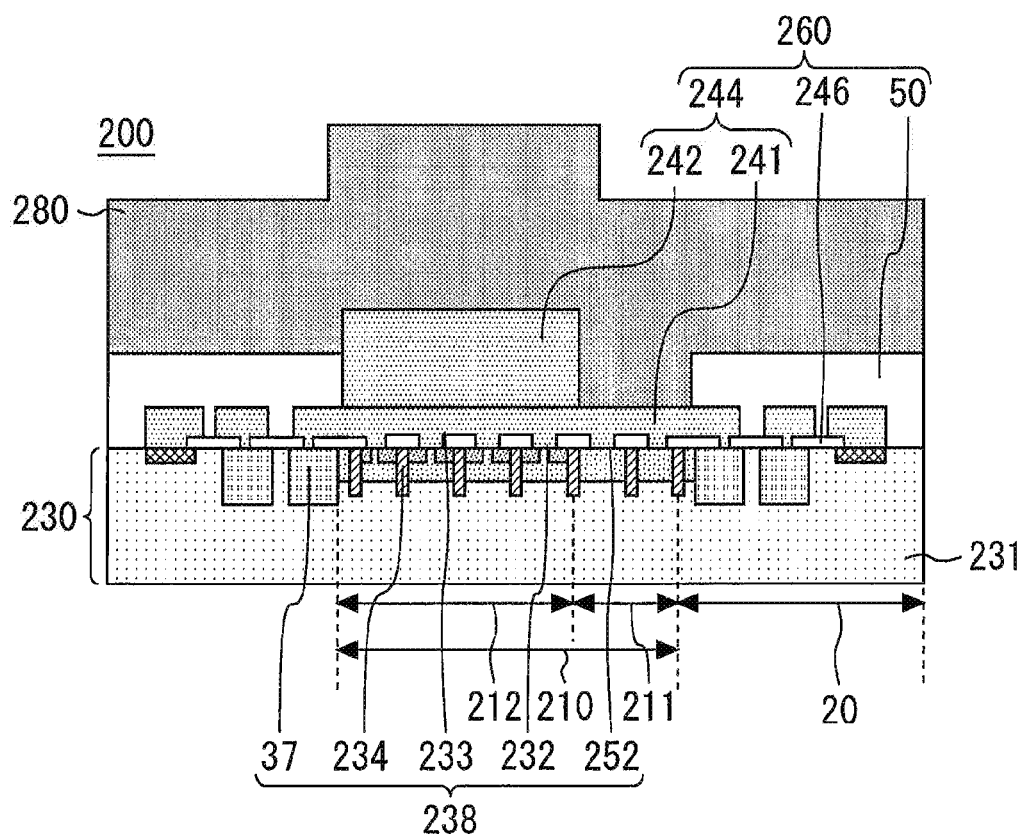
FIG. 15 is a diagram showing a method of manufacturing the semiconductor device according to the embodiment 2 of the present invention.
Figure 16:
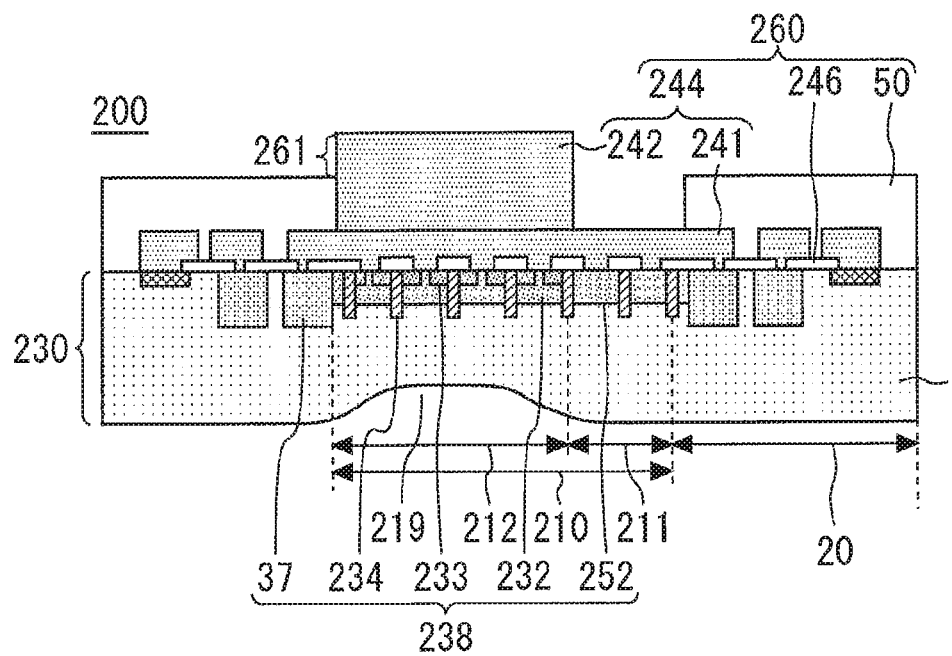
FIG. 16 is a diagram showing a method of manufacturing the semiconductor device according to the embodiment 2 of the present invention.

Subsequently, as shown in FIG. 15, a protective film 280 is stuck onto the surface structure 260. Next, a polishing step is executed to polish the back surface of the substrate 230. In the present embodiment, the convex portion 261 is formed above the IGBT region 212. Accordingly, by polishing the back surface of the substrate 230, a portion facing the convex portion 261 is deeply polished. Therefore, as shown in FIG. 16, the IGBT region 212 of the substrate 230 is thinly formed.

Figure 17:
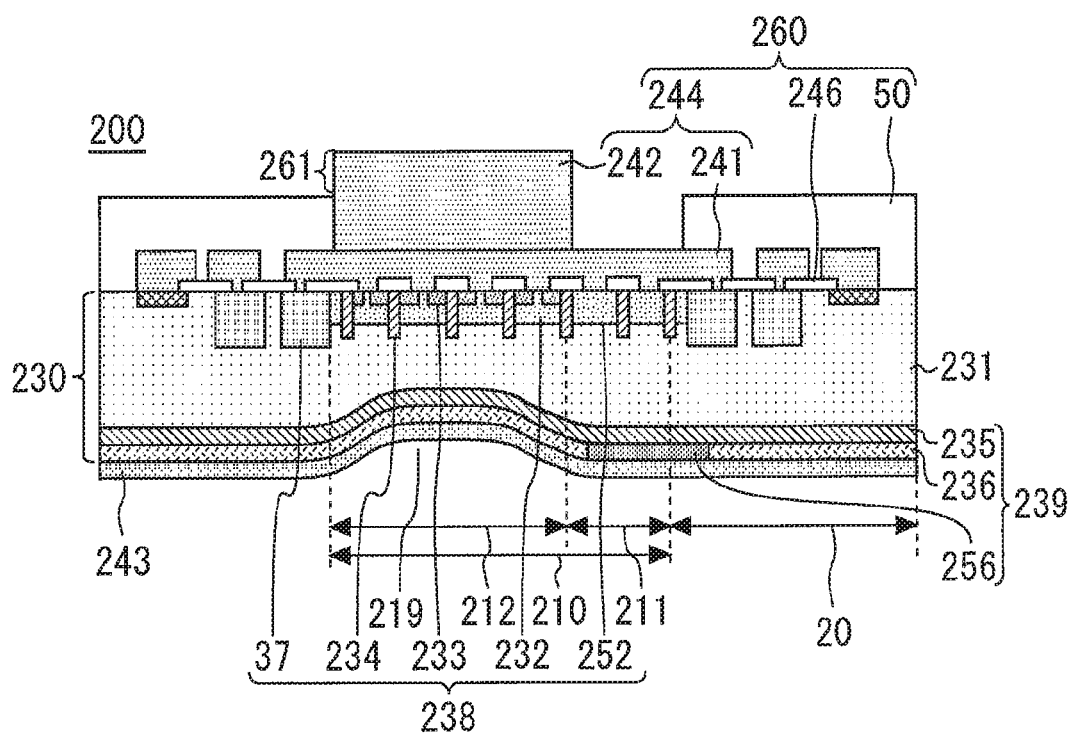
FIG. 17 is a diagram showing a method of manufacturing the semiconductor device according to the embodiment 2 of the present invention.

Next, as shown in FIG. 17, a back surface step is executed. In the back surface step, the buffer layer 235 is formed on the back surface side of the substrate 230. Subsequently, the cathode 256 is formed on the back surface of the buffer layer 235. Subsequently, the collector 236 is formed by resist injection based on the photolithography processing. Subsequently, the back surface electrode 243 is formed on the back surfaces of the collector 236 and the cathode 256. Through the above steps, the semiconductor device 200 according to the present embodiment is formed.

In the semiconductor device 200 according to the present embodiment, the convex portion 261 is formed above the IGBT region 212. Accordingly, the IGBT region 212 of the substrate 230 is formed to be thinner than the diode region 211 by the polishing step. Therefore, it is possible to reduce the resistance of the IGBT region 212 through which main current flows. In addition, the terminal portion 20 and the diode region 211 are thicker than the IGBT region 212. Therefore, the strength and the withstand voltage can be maintained.

Furthermore, in the diode, there is a period during which current flows in a reverse direction when a bias direction is switched from a forward bias state. A surge voltage in a recovery period which is a period during which current flows in the reverse direction is generally harder to oscillate as the substrate is thicker. In the present embodiment, the diode region 211 of the substrate 230 is formed to be thicker than the IGBT region. Accordingly, enhancement of recovery tolerance can be expected as compared with the embodiment 1.

Embodiment 3

Figure 18:
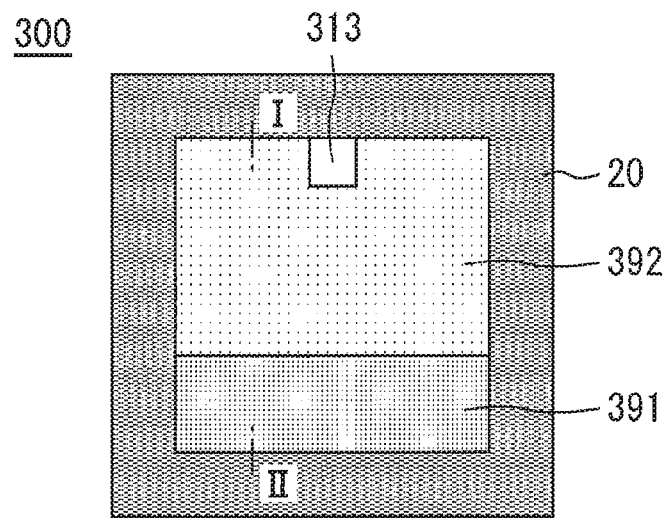
FIG. 18 is a plan view of a semiconductor device according to an embodiment 3 of the present invention.

FIG. 18 is a plan view of a semiconductor device according to an embodiment 3 of the present invention. An IGBT 392 and a diode 391 are formed in the semiconductor device 300 according to the present embodiment. The diode 391 is formed adjacently to the IGBT 392. The IGBT 392 and the diode 391 are surrounded by the terminal portion 20. The structure of the terminal portion 20 is the same as that of the embodiment 1. A gate pad 313 for supplying electric power to the gate 234 of the IGBT 392 is formed at an end portion of the IGBT 392.

Figure 19:
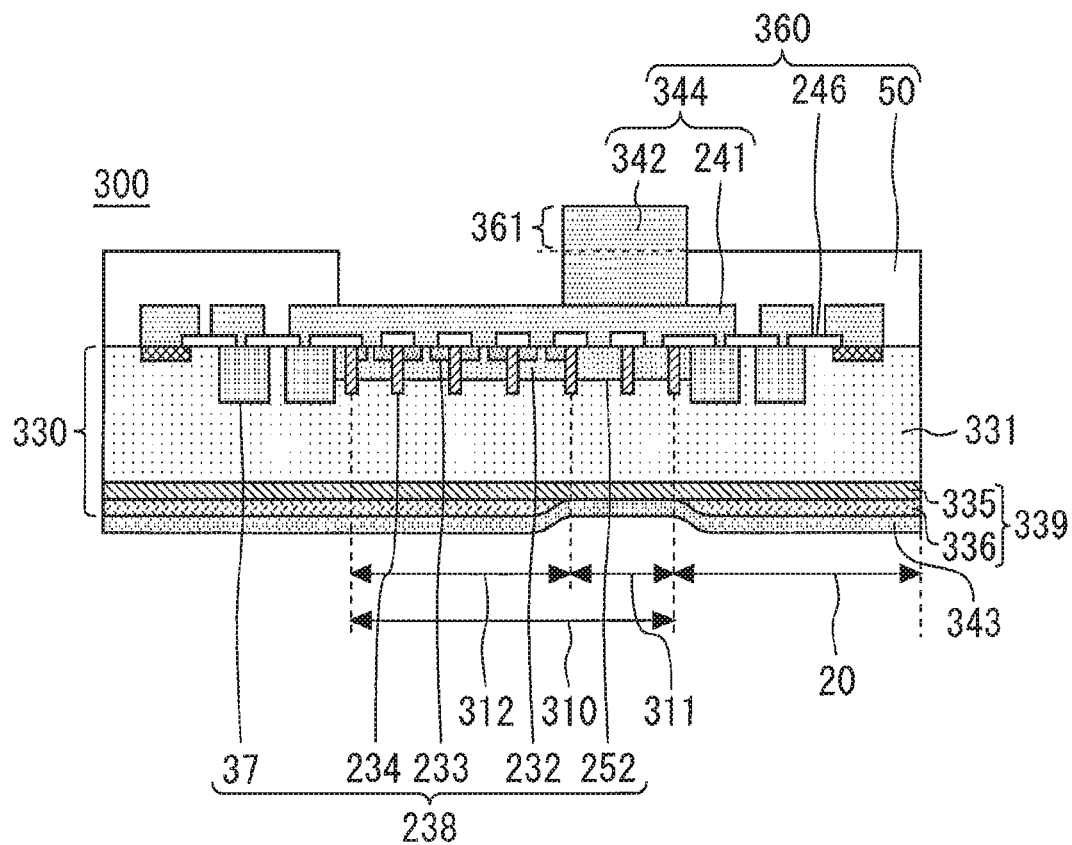
FIG. 19 is a cross-sectional view of the semiconductor device according to the embodiment 3 of the present invention.

FIG. 19 is a cross-sectional view of the semiconductor device according to the embodiment 3 of the present invention. FIG. 19 is a cross-sectional view obtained by cutting the semiconductor device 300 shown in FIG. 18 with a line I-II. The semiconductor device 300 includes a substrate 330, a surface structure 360 provided on the substrate 330, and a back surface electrode 343 provided on the back surface of the substrate 330. The substrate 330 includes a cell portion 310 and a terminal portion 20 surrounding the cell portion 310.

The cell portion 310 is provided with an IGBT region 312 and a diode region 311 provided adjacently to the IGBT region 312. The IGBT region 312 is a region where the IGBT 392 of the cell portion 310 is formed. The diode region 311 is a region where the diode 391 of the cell portion 310 is formed.

In the present embodiment, the substrate 330 includes a drift layer 331, a surface layer 238, and a back surface semiconductor layer 339. The structure of the surface layer 238 is the same as that of the embodiment 2. In the IGBT region 312, an N-type buffer layer 335 is formed on the back surface of the drift layer 331. A P-type collector 336 is formed on the back surface of the buffer layer 335. In the diode region 311, the buffer layer 335 is formed on the back surface of the drift layer 331. The buffer layer 335 is exposed from the collector 336 in the diode region 311. The back surface semiconductor layer 339 contains the buffer layer 335 and the collector 336.

The structures of the insulating layer 246 and the aluminum electrode 241 according to the present embodiment are the same as those of the embodiment 2. In the present embodiment, the metal electrode 342 is provided on the aluminum electrode 241 above the diode region 311. The metal electrode 342 is formed over an entire region above the diode region 311. The aluminum electrode 241 and the metal electrode 342 form a surface electrode 344. The insulating layer 246, the surface electrode 344, and the insulating film 50 constitute the surface structure 360. The upper surface of the metal electrode 342 is higher than the upper surface of the insulating film 50. Therefore, the surface structure 360 has a convex portion 361 protruding upward above the diode region 311.

The back surface electrode 343 is provided on the back surface of the substrate 330. Here, the buffer layer 335 is exposed from the collector 336 in the diode region 311. Accordingly, in the diode region 311, the buffer layer 335 is in contact with the back surface electrode 343. In the present embodiment, the diode 391 is formed by bringing the N-type buffer layer 335 and the back surface electrode 343 into contact with each other. Through the above steps, the IGBT 392 which is a trench IGBT and the diode 391 are formed in the semiconductor device 300. Therefore, the semiconductor device 300 becomes RC-IGBT like the semiconductor device 200.

Figure 20:
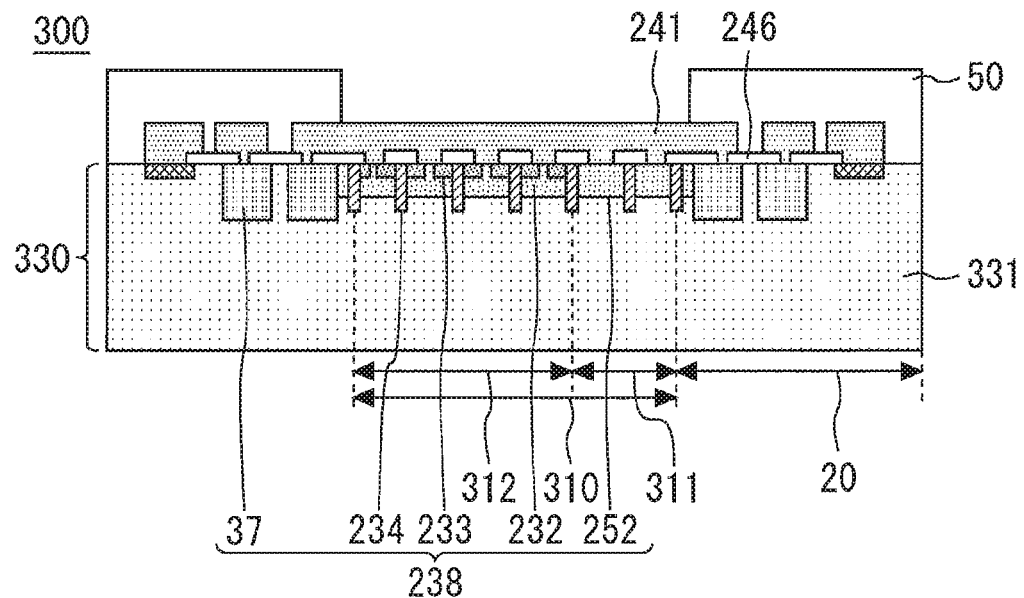
FIG. 20 is a diagram showing the method of manufacturing the semiconductor device according to the embodiment 3 of the present invention.

Next, a method of manufacturing the semiconductor device 300 according to the present embodiment will be described. FIGS. 20 to 25 are diagrams showing the method of manufacturing the semiconductor device according to the embodiment 3 of the present invention. As shown in FIG. 20, the method of manufacturing the semiconductor device 300 is the same as that of the embodiment 2 up to the step of forming the insulating film 50.

Figure 21:
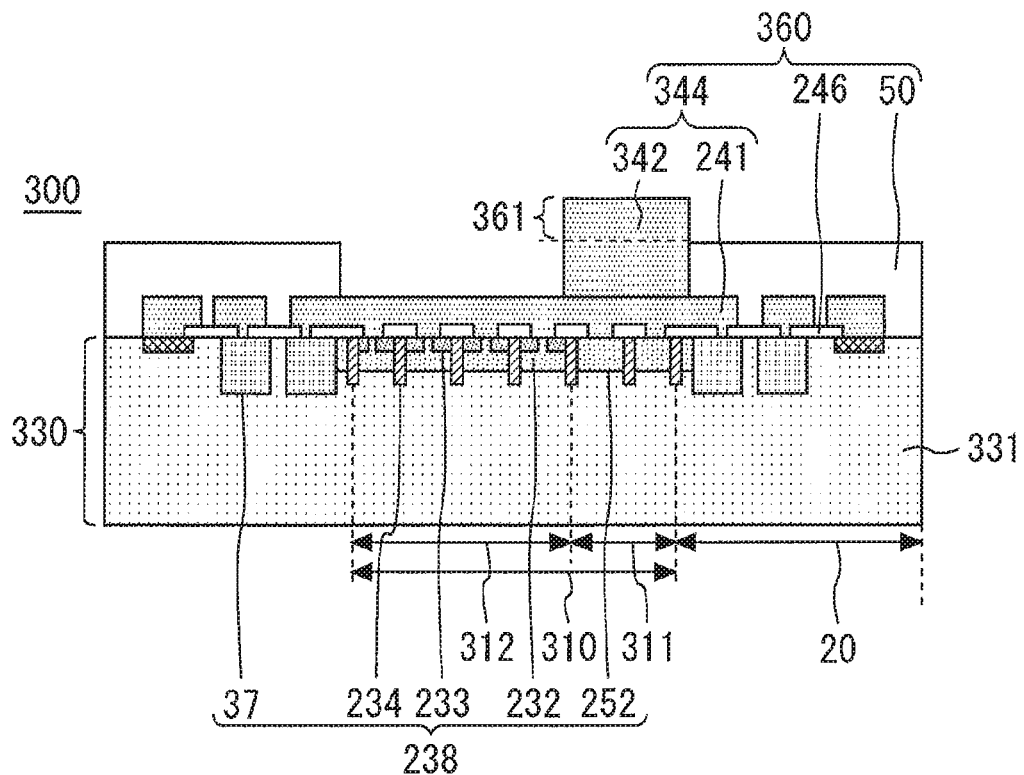
FIG. 21 is a diagram showing the method of manufacturing the semiconductor device according to the embodiment 3 of the present invention.

Subsequently, as shown in FIG. 21, the metal electrode 342 is formed on the aluminum electrode 241 so as to cover the entire region of the upper portion of the diode region 311. As in the case of the embodiment 1, the metal electrode 342 is formed so that the upper surface thereof is located at a position higher than the upper surface of the insulating film 50.

Figure 22:
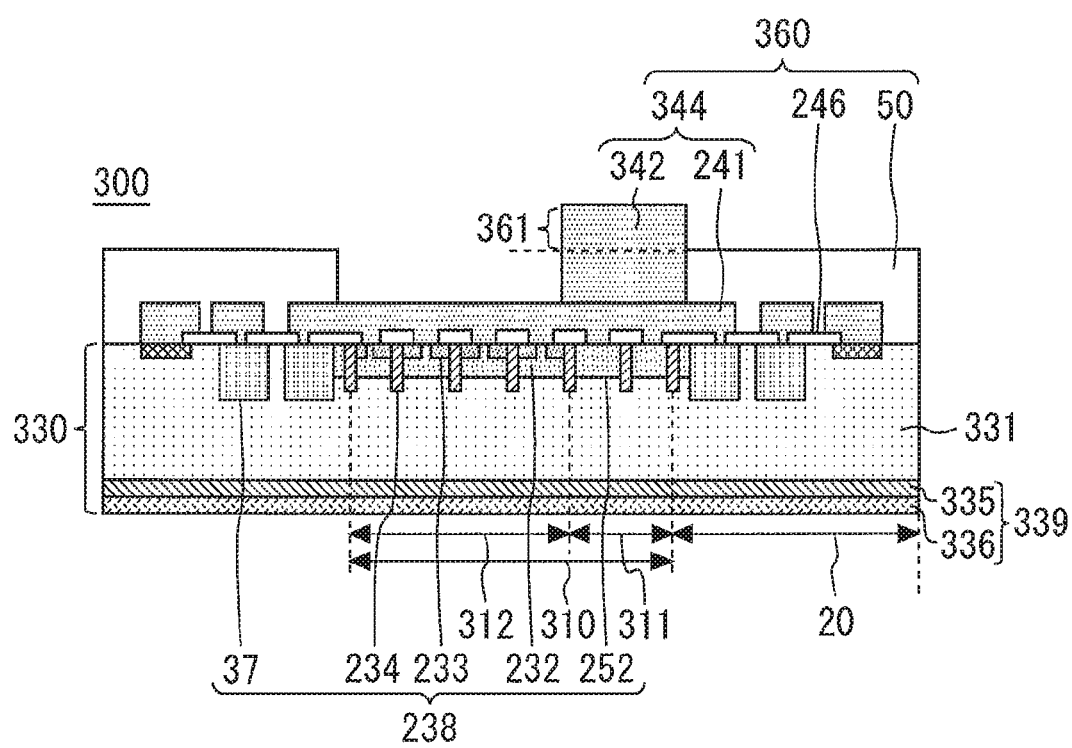
FIG. 22 is a diagram showing the method of manufacturing the semiconductor device according to the embodiment 3 of the present invention.

Next, as shown in FIG. 22, a back surface step is executed. In the back surface step, the back surface semiconductor layer 339 is formed. First, the buffer layer 335 is formed on the back surface side of the substrate 330. Subsequently, the collector 336 is formed on the back surface of the buffer layer 335.

Figure 23:
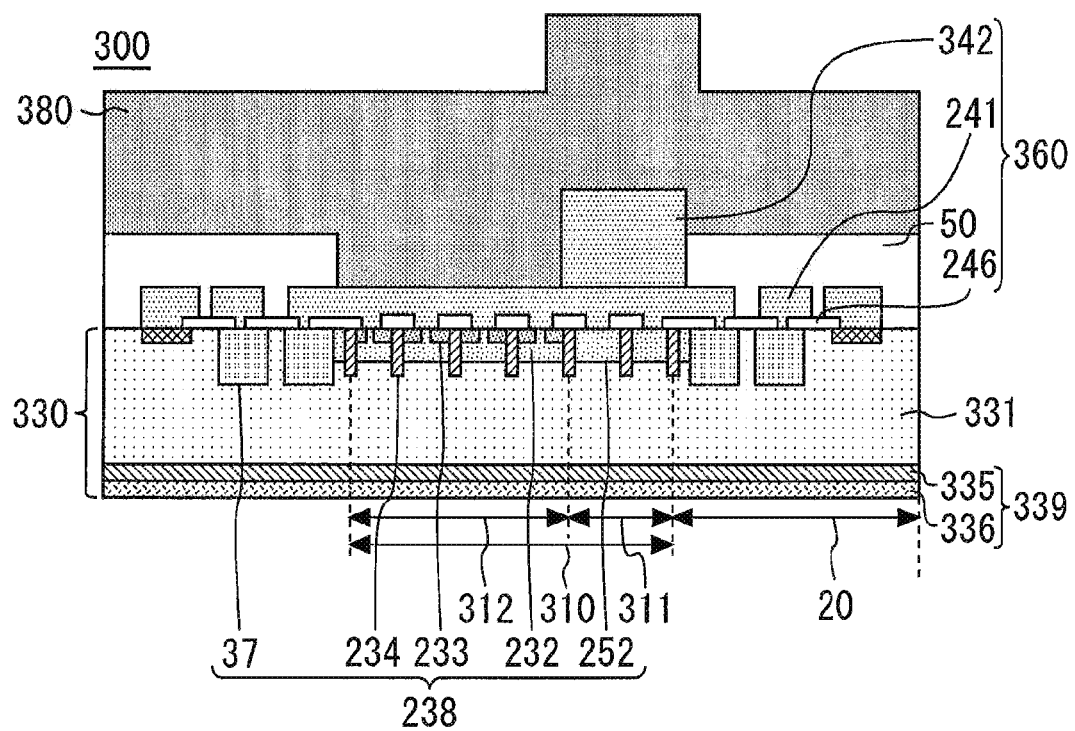
FIG. 23 is a diagram showing the method of manufacturing the semiconductor device according to the embodiment 3 of the present invention.
Figure 24:
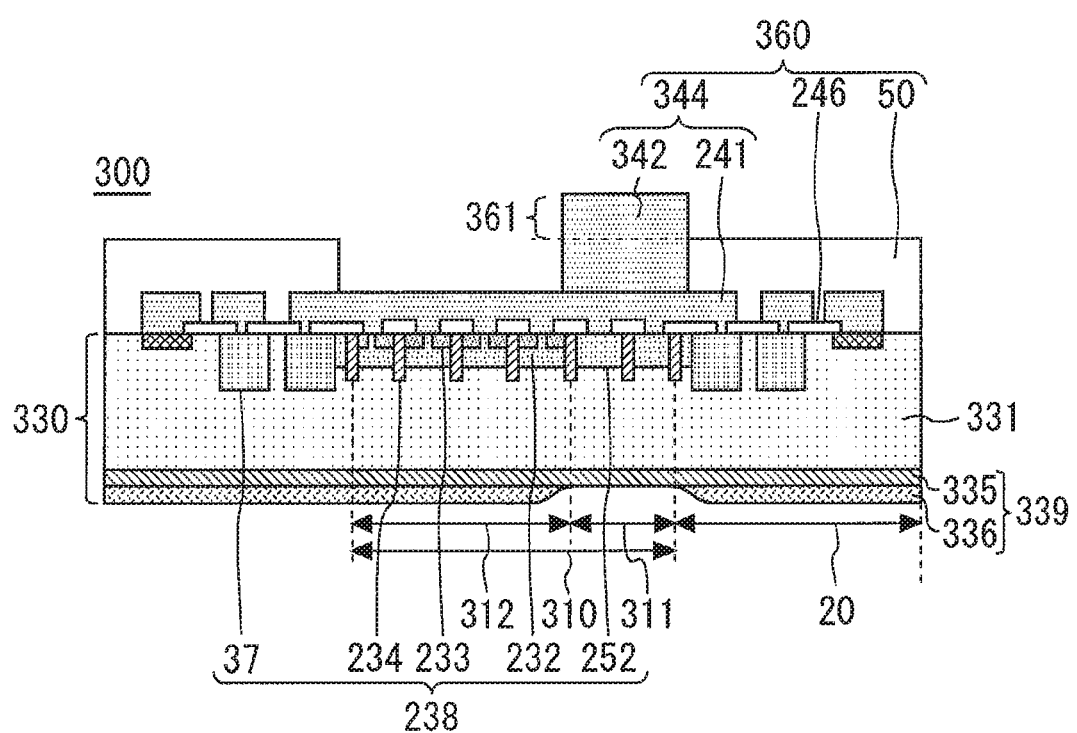
FIG. 24 is a diagram showing the method of manufacturing the semiconductor device according to the embodiment 3 of the present invention.

Subsequently, as shown in FIG. 23, a protective film 380 is stuck onto the surface structure 360. Next, a polishing step is executed. In the present embodiment, the polishing step is executed after the back surface step. Accordingly, in the polishing step, the back surface semiconductor layer 339 is polished. In the present embodiment, the surface electrode 344 has the convex portion 361 above the diode region 311. Accordingly, the back surface of the back surface semiconductor layer 339 is deeply polished at a position facing the convex portion 361. Accordingly, as shown in FIG. 24, the diode region 311 of the substrate 330 is thinly formed. In the polishing step, polishing is performed so that the collector 336 in the diode region 311 is removed and the buffer layer 335 is exposed.

Figure 25:
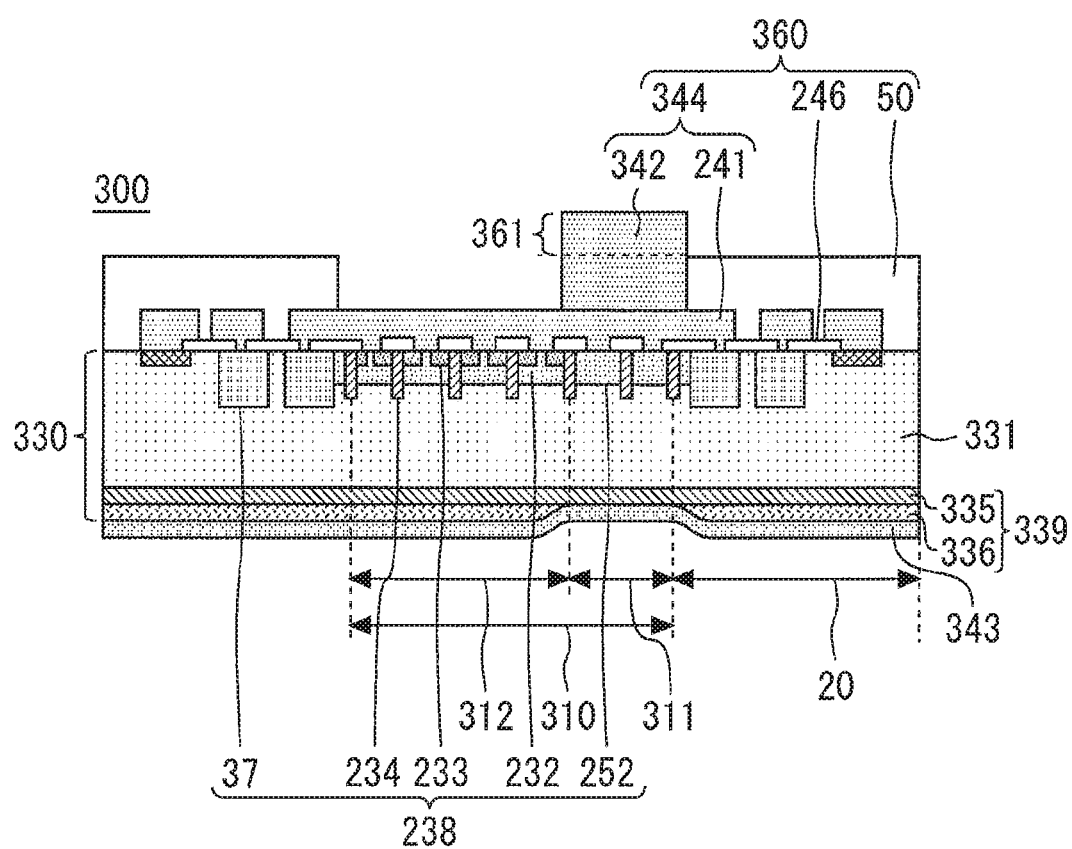
FIG. 25 is a diagram showing the method of manufacturing the semiconductor device according to the embodiment 3 of the present invention.

Subsequently, as shown in FIG. 25, the hack surface electrode 343 is formed on the back surface of the collector 336. The back surface electrode 343 is provided so as to be in contact with the buffer layer 335 at a portion where the collector 336 is removed and the buffer layer 335 is exposed. Through the above steps, the semiconductor device 300 according to the present embodiment is formed.

In the embodiment 2, the photolithography processing and the ion implantation are performed, and a part of the P-type collector 236 is replaced with the N-type cathode 256, thereby forming the diode 291. On the other hand, in the present embodiment, a part of the collector 336 is removed in the polishing step, thereby forming the diode 391. Accordingly, in the present embodiment, the diode 391 can be formed without adding the photolithography processing step and the etching step. Therefore, RC-IGBT can be obtained by a simple process. In addition, since a part of the cell portion 310 is thinned, an effect of reducing the resistance can be obtained.

In the present embodiment, the buffer layer 335 is exposed in the polishing step. As a modification of the present embodiment, the drift layer 331 may be exposed in the polishing step. In this case, the back surface electrode 343 is formed so that the N-type drift layer 331 and the back surface electrode 343 are in contact with each other. Note that the technical features described in the above embodiments may be combined as appropriate.

REFERENCE SIGNS LIST 100,200,300,400,500 semiconductor device, 10,210,310 cell portion, 20 terminal portion, 30,230,330 substrate, 60,260, 360 surface structure, 61,261,361,561 convex portion, 44,244,344 surface electrode, 43,243,343 back surface electrode, 212,312 IGBT region, 211,311 diode region, 50 insulating film, 451 gap, 80,280,380 protective film, 38,238 surface layer, 39,239,339 back surface semiconductor layer, 32,232 base, 33,233 emitter, 34,234 gate, 35,235,335 buffer layer, 36,236,336 collector, 256 cathode, 252 anode

The invention claimed is:

1. A semiconductor device comprising:
 a substrate including a cell portion and a terminal portion surrounding the cell portion;
 a surface structure provided on the substrate; and
 a back surface electrode provided on a back surface of the substrate,
 wherein the surface structure includes a convex portion protruding upward above the cell portion,
 at least a part of the cell portion is thinner than the terminal portion,
 the back surface electrode under the cell portion and the back surface electrode under the terminal portion form a concave shape,
 a lower surface of the back surface electrode under the cell portion and a lower surface of the back surface electrode under the terminal portion are smoothly connected to each other,
 the surface structure includes a surface electrode provided on the substrate and an insulating film provided on the substrate, the surface electrode having a base portion and an upper portion, the upper portion being on the base portion and narrower than the base portion in plan view, and
 the convex portion is a part of the surface electrode, and the insulating film directly contacts a portion of the upper portion of the surface electrode below the convex portion.

2. The semiconductor device according to claim 1, wherein
 the cell portion is provided with an IGBT region and a diode region provided adjacently to the IGBT region,
 the convex portion is provided above the IGBT region, and
 the IGBT region is thinner than the diode region.

3. The semiconductor device according to claim 1, wherein the cell portion is provided with an IGBT region and a diode region provided adjacently to the IGBT region, the convex portion is provided above the diode region, and the diode region is thinner than the IGBT region.

4. The semiconductor device according to claim 3, wherein the substrate is of N-type, the substrate includes an N-type buffer layer and a P-type collector on a back surface side of the IGBT region, and the buffer layer is provided on a back surface side of the diode region.

5. The semiconductor device according to claim 1, wherein the convex portion is thinner than the substrate.

6. The semiconductor device according to claim 1, wherein the substrate is formed of a wide bandgap semiconductor.

7. The semiconductor according to claim 6, wherein the wide bandgap semiconductor is silicon carbide, gallium nitride based material or diamond.

8. A method of manufacturing a semiconductor device comprising:

a surface step of forming a surface layer on a surface side of a substrate including a cell portion and a terminal portion surrounding the cell portion;

a surface structure step of forming a surface structure having a convex portion protruding upward above the cell portion after executing the surface step;

a step of sticking a protective film so that the protective film covers the surface structure;

a polishing step of polishing a back surface of the substrate while the protective film is stuck;

a back surface step of forming a back surface semiconductor layer on a back surface side of the substrate; and a step of forming a back surface electrode on a back surface of the back surface semiconductor layer after executing the polishing step, wherein at least a part of the cell portion is thinner than the terminal portion, the back surface electrode under the cell portion and the back surface electrode under the terminal portion form a concave shape, a lower surface of the back surface electrode under the cell portion and a lower surface of the back surface electrode under the terminal portion are smoothly connected to each other, the surface structure includes a surface electrode provided on the substrate and an insulating film provided on the substrate, the surface electrode having a base portion and an upper portion, the upper portion being on the base portion and narrower than the base portion in plan view, and the convex portion is a part of the surface electrode, and the insulating film directly contacts a portion of the upper portion of the surface electrode below the convex portion.

9. The method of manufacturing a semiconductor device according to claim 8, wherein a base, an emitter, and an anode adjacent to the base are formed in the cell portion in the surface step;

the convex portion is formed above the base and the emitter in the surface structure step;

a buffer layer is formed on the substrate, and a collector and a cathode are formed on a back surface of the buffer layer in the back surface step; and the polishing step is executed prior to the back surface step.

10. The method of manufacturing a semiconductor device according to claim 8, wherein a base, an emitter, and an anode adjacent to the base are formed in the cell portion in the surface step;

the convex portion is formed above the anode in the surface structure step;

a buffer layer is formed on the substrate, and a collector is formed on a back surface of the buffer layer in the back surface step; and the polishing step is executed after the back surface step.

11. The method of manufacturing a semiconductor device according to claim 8, wherein the convex portion is formed to be thinner than the substrate.

12. The method of manufacturing a semiconductor device according to claim 8, wherein the substrate is formed of a wide bandgap semiconductor.

13. A semiconductor device comprising:

a substrate including a cell portion and a terminal portion surrounding the cell portion;

a surface structure provided on the substrate; and a back surface electrode provided on a back surface of the substrate, wherein the surface structure includes a convex portion protruding upward above the cell portion, at least a part of the cell portion is thinner than the terminal portion, the back surface electrode under the cell portion and the back surface electrode under the terminal portion form a concave shape, a lower surface of the back surface electrode under the cell portion and a lower surface of the back surface electrode under the terminal portion are smoothly connected to each other, the surface structure includes a surface electrode provided on the substrate, the convex portion is a part of the surface electrode, the cell portion is provided with an IGBT region and a diode region provided adjacently to the IGBT region, the convex portion is provided above the IGBT region, and the IGBT region is thinner than the diode region.

14. The semiconductor device according to claim 13, wherein the surface structure includes an insulating film provided on the surface electrode above the terminal portion, and a gap is provided between the insulating film and the convex portion.

15. The method of manufacturing a semiconductor device according to claim 12, wherein the wide bandgap semiconductor is silicon carbide, gallium nitride based material or diamond.

16. A semiconductor device comprising:

a substrate including a cell portion and a terminal portion surrounding the cell portion;

a surface structure provided on the substrate; and a back surface electrode provided on a back surface of the substrate, wherein the surface structure includes a convex portion protruding upward above the cell portion, at least a part of the cell portion is thinner than the terminal portion, the back surface electrode under the cell portion and the back surface electrode under the terminal portion form a concave shape, a lower surface of the back surface electrode under the cell portion and a lower surface of the back surface electrode under the terminal portion are smoothly connected to each other, the surface structure includes a surface electrode provided on the substrate, the convex portion is a part of the surface electrode, the cell portion is provided with an IGBT region and a diode region provided adjacently to the IGBT region, the convex portion is provided above the diode region, and the diode region is thinner than the IGBT region.

17. The semiconductor device according to claim 16, wherein the surface structure includes an insulating film provided on the surface electrode above the terminal portion, and a gap is provided between the insulating film and the convex portion.

18. A method of manufacturing a semiconductor device comprising:

a surface step of forming a surface layer on a surface side of a substrate including a cell portion and a terminal portion surrounding the cell portion;

a surface structure step of forming a surface structure having a convex portion protruding upward above the cell portion after executing the surface step;

a step of sticking a protective film so that the protective film covers the surface structure;

a polishing step of polishing a back surface of the substrate while the protective film is stuck;

a back surface step of forming a back surface semiconductor layer on a back surface side of the substrate; and a step of forming a back surface electrode on a back surface of the back surface semiconductor layer after executing the polishing step, wherein at least a part of the cell portion is thinner than the terminal portion, the back surface electrode under the cell portion and the back surface electrode under the terminal portion form a concave shape, a lower surface of the back surface electrode under the cell portion and a lower surface of the back surface electrode under the terminal portion are smoothly connected to each other, the convex portion is a part of a surface electrode provided on the substrate, the cell portion is provided with an IGBT region and a diode region provided adjacently to the IGBT region, the convex portion is provided above the IGBT region, and the IGBT region is thinner than the diode region.

19. The method of manufacturing a semiconductor device according to claim 18, wherein the surface structure step includes a step of providing an insulating film on the surface electrode above the terminal portion, and the insulating film is formed while a gap is provided between the insulating film and the convex portion.

20. A method of manufacturing a semiconductor device comprising:

a surface step of forming a surface layer on a surface side of a substrate including a cell portion and a terminal portion surrounding the cell portion;

a surface structure step of forming a surface structure having a convex portion protruding upward above the cell portion after executing the surface step;

a step of sticking a protective film so that the protective film covers the surface structure;

a polishing step of polishing a back surface of the substrate while the protective film is stuck;

a back surface step of forming a back surface semiconductor layer on a back surface side of the substrate; and a step of forming a back surface electrode on a back surface of the back surface semiconductor layer after executing the polishing step, wherein at least a part of the cell portion is thinner than the terminal portion, the back surface electrode under the cell portion and the back surface electrode under the terminal portion form a concave shape, a lower surface of the back surface electrode under the cell portion and a lower surface of the back surface electrode under the terminal portion are smoothly connected to each other, the convex portion is a part of a surface electrode provided on the substrate, the cell portion is provided with an IGBT region and a diode region provided adjacently to the IGBT region, the convex portion is provided above the diode region, and the diode region is thinner than the IGBT region.

* * * * *